United States Patent
Imaoka et al.

(10) Patent No.: US 10,680,068 B2
(45) Date of Patent: Jun. 9, 2020

(54) SEMICONDUCTOR SUBSTRATE

(71) Applicant: SICOXS CORPORATION, Tokyo (JP)

(72) Inventors: Ko Imaoka, Kariya (JP); Takanori Murasaki, Kariya (JP); Toshihisa Shimo, Kariya (JP); Hidetsugu Uchida, Tokyo (JP); Akiyuki Minami, Tokyo (JP)

(73) Assignee: SICOXS CORPORATION, Tokyo (JP)

(*) Notice: Subject to any disclaimer, the term of this patent is extended or adjusted under 35 U.S.C. 154(b) by 0 days.

(21) Appl. No.: 16/319,053

(22) PCT Filed: Jul. 13, 2017

(86) PCT No.: PCT/JP2017/025600
§ 371 (c)(1),
(2) Date: Jan. 18, 2019

(87) PCT Pub. No.: WO2018/016417
PCT Pub. Date: Jan. 25, 2018

(65) Prior Publication Data
US 2020/0006493 A1    Jan. 2, 2020

(30) Foreign Application Priority Data
Jul. 19, 2016 (JP) .................. 2016-141782

(51) Int. Cl.
    *H01L 29/16*    (2006.01)
    *H01L 29/04*    (2006.01)
(52) U.S. Cl.
    CPC .......... *H01L 29/1608* (2013.01); *H01L 29/04* (2013.01)

(58) Field of Classification Search
    CPC ..... H01L 29/36; H01L 29/1608; H01L 29/167
    See application file for complete search history.

(56) References Cited

U.S. PATENT DOCUMENTS

| 6,328,796 B1 | 12/2001 | Kub et al. |
| 2003/0141502 A1 | 7/2003 | Tong |

(Continued)

FOREIGN PATENT DOCUMENTS

| CN | 102449732 A | 5/2012 |
| CN | 102449734 A | 5/2012 |

(Continued)

OTHER PUBLICATIONS

Communication dated Jun. 5, 2019, from the State Intellectual Property Office of People's Republic of China in counterpart Application No. 201780044382.X.

(Continued)

*Primary Examiner* — Thomas L Dickey
(74) *Attorney, Agent, or Firm* — Sughrue Mion, PLLC

(57) ABSTRACT

A technique related to a bonded semiconductor substrate capable of reducing an interface resistance is provided. The semiconductor substrate comprises a single-crystalline SiC substrate and a polycrystalline SiC substrate. The single-crystalline SIC substrate and the polycrystalline SiC substrate are bonded. A bonded region of the single-crystalline SiC substrate and the polycrystalline SiC substrate contains $1 \times 10^{21}$ (atoms/cm$^3$) or more of particular atoms.

16 Claims, 9 Drawing Sheets

(56) References Cited

U.S. PATENT DOCUMENTS

| | | |
|---|---|---|
| 2009/0321747 A1 | 12/2009 | Murphy et al. |
| 2011/0227068 A1 | 9/2011 | Akiyama |
| 2011/0316003 A1 | 12/2011 | Murphy et al. |
| 2012/0012862 A1 | 1/2012 | Nishiguchi et al. |
| 2012/0025208 A1 | 2/2012 | Nishiguchi et al. |
| 2012/0032191 A1 | 2/2012 | Harada et al. |
| 2012/0119336 A1 | 5/2012 | Akiyama |
| 2012/0168774 A1 | 7/2012 | Masuda et al. |
| 2013/0000547 A1 | 1/2013 | Kogoi |
| 2017/0213735 A1 | 7/2017 | Imaoka et al. |

FOREIGN PATENT DOCUMENTS

| | | |
|---|---|---|
| CN | 102597338 A | 7/2012 |
| JP | 2008-069059 A | 3/2008 |
| JP | 2008230946 A | 10/2008 |
| JP | 2010-016102 A | 1/2010 |
| JP | 2010-502023 A | 1/2010 |
| JP | 2010-161355 A | 7/2010 |
| JP | 2010-161359 A | 7/2010 |
| JP | 2010-263073 A | 11/2010 |
| JP | 2011-184224 A | 9/2011 |
| JP | 2012-146694 A | 8/2012 |
| JP | 2015-220321 A | 12/2015 |
| KR | 10-2012-0022952 A | 3/2012 |
| WO | 2011/046020 A1 | 4/2011 |
| WO | 2016/006663 A1 | 1/2016 |
| WO | WO-2016006663 A1 * | 1/2016 ......... H01L 29/1608 |

OTHER PUBLICATIONS

International Search Report of PCT/JP2017/025600 dated Sep. 12, 2017.
Written Opinion of the International Searching Authority of PCT/JP2017/025600 dated Sep. 12, 2017.
Written Opinion of PCT/JP2017/025600 dated Sep. 12, 2017.
The Extended European Search Report dated Dec. 13, 2019, issued by the European Patent Office in corresponding application No. 17830936.5.
Communication dated May 1, 2019, issued by the Korean Intellectual Property Office in corresponding Korean Application No. 10-2019-7004382.
Communication dated Mar. 10, 2020 by the State Intellectual Property Office of the P.R. of China in application No. 201780044382.X.

* cited by examiner

SEMICONDUCTOR SUBSTRATE

TECHNICAL FIELD

This application is a National Stage of International Application No. PCT/JP2017/025600 filed Jul. 13, 2017, and claims priority to Japanese Patent Application No. 2016-141782 filed on Jul. 19, 2016, the contents of which are hereby incorporated by reference into the present application. The description herein discloses a technique related to a bonded semiconductor substrate capable of reducing an interface resistance.

BACKGROUND ART

There is a known technique to bond SiC single crystalline and SiC polycrystalline. As a related technique, a technique described in JP 2012-146694 A is known.

SUMMARY OF INVENTION

Technical Problem

When SiC single crystalline and SiC polycrystalline are bonded directly, there is a case where an electric resistance at a bonded interface becomes high. When this happens, an adverse effect is imposed on device characteristics in manufacturing a device in which a current path is configured to cross over the bonded interface.

Solution to Problem

The present description discloses a semiconductor substrate. The semiconductor substrate comprises a single-crystalline SiC substrate and a polycrystalline SiC substrate. The single-crystalline SiC substrate and the polycrystalline SiC substrate are bonded. A bonded region of the single-crystalline SiC substrate and the polycrystalline SiC substrate contains $1 \times 10^{21}$ (atoms/cm3) or more of particular atoms.

When the single-crystalline SiC substrate and the polycrystalline SiC substrate are bonded directly, a potential barrier is generated, by which an interface resistance becomes high. In the above semiconductor substrate, the single-crystalline SiC substrate and the polycrystalline SiC substrate are bonded. Since a potential barrier is generated at a bonded interface of the single-crystalline SiC substrate and the polycrystalline SiC substrate, an interface resistance component thereby exists. However, the interface resistance can be suppressed by having the particular atoms contained at $1 \times 10^{21}$ (atoms/cm$^3$) or more.

Advantageous Effects of Invention

According to the teachings disclosed herein, a technique that improves an electric characteristic of a semiconductor substrate having a single-crystalline SiC substrate and a polycrystalline SiC substrate bonded can be provided.

DESCRIPTION OF THE EMBODIMENTS

Preferred aspects of embodiments disclosed herein will be listed. It should be noted that elements described below may technically be useful alone.

(Feature 1) The particular atoms may be atoms that alter at least a part of a SiC crystal structure in the bonded region when the atoms are present in the bonded region at a density of $1 \times 10^{21}$ (atoms/cm$^3$) or more.

(Feature 2) The particular atoms may be at least one of nitrogen (N), phosphorus (P), boron (B), aluminum (Al), silicon (Si), and carbon (C).

(Feature 3) The single-crystalline SiC substrate and the polycrystalline SiC substrate may be bonded via an interface layer. A thickness of the interface layer may be equal to or more than 0.25 nanometer.

(Feature 4) The particular atoms may be nitrogen (N). The interface layer may be a composite material containing carbon, silicon, and nitrogen.

(Feature 5) The particular atoms may be phosphorus (P). The interface layer may be a composite material containing carbon, silicon, and phosphorus.

(Feature 6) The particular atoms may be silicon (Si). The interface layer may be a composite material containing carbon and silicon. In an element composition ratio in the composite material, a ratio of silicon may be more than that of carbon.

(Feature 7) The particular atoms may be carbon (C). The interface layer may be a composite material containing carbon and silicon. In an element composition ratio in the composite material, a ratio of carbon may be more than that of silicon.

(Feature 8) The interface layer may contain $1 \times 10^{22}$ (atoms/cm$^3$) or more of the particular atoms.

(Feature 9) In an element composition ratio in the interface layer, a ratio of the particular atoms may be 10 (atomic %) or more.

(Feature 10) The single-crystalline SiC substrate may be 4H—SiC—SiC.

(Feature 11) The polycrystalline SiC substrate may be 3C—SiC.

Embodiment

Configuration of Bonded Substrate

Figure 2:
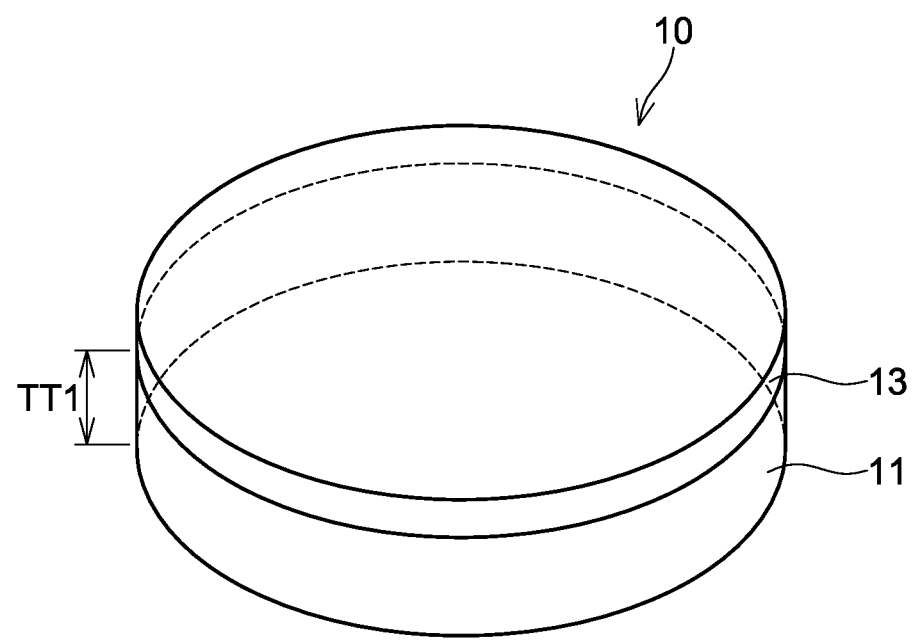
FIG. 2 is a perspective view of the bonded substrate.
Figure 3:
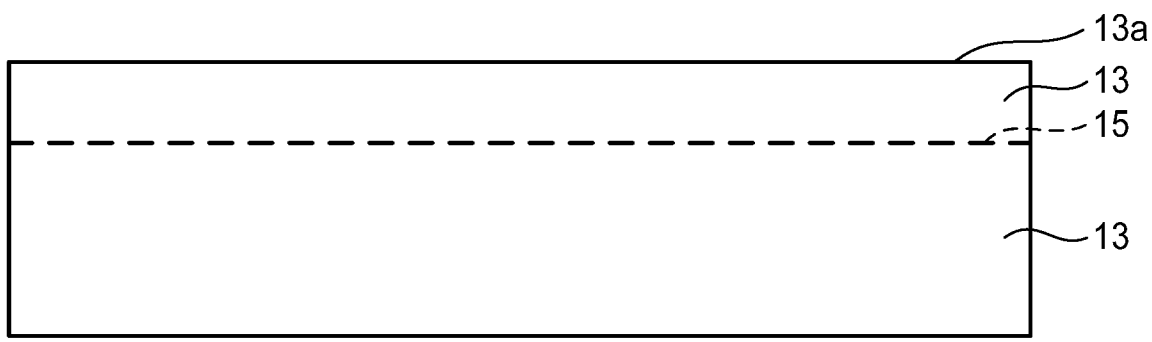
FIG. 3 is a schematic view of the bonded substrate.
Figure 4:
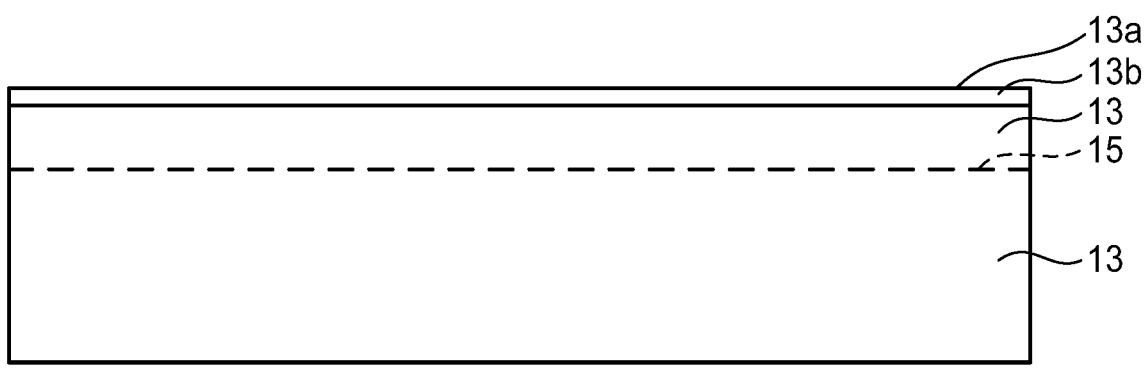
FIG. 4 is a schematic view of the bonded substrate.

FIG. 2 is a perspective view of a bonded substrate 10 according to the present embodiment. The bonded substrate 10 has an approximately disc-like shape. The bonded substrate 10 includes a support substrate 11 disposed on the underside, and a single-crystalline layer 13 bonded to the upper surface of the support substrate 11. The single-crystalline layer 13 may be formed from, for example, single crystals of a compound semiconductor (e.g., 6H—SiC, 4H—SiC, GaN, AlN). Alternatively, it may be formed from single crystals of a mono-element semiconductor (e.g., Si, C).

For the support substrate 11, various materials can be used. It is preferable that the support substrate 11 is resistant to various thermal processes applied to the single-crystalline layer 13. Additionally, it is preferable that the support substrate 11 is formed from a material with a small difference in thermal expansion coefficient between the single-crystalline layer 13 and this substrate 11. For example, if SiC is used for the single-crystalline layer 13, single-crystalline SiC, polycrystalline SiC, single-crystalline Si, polycrystalline Si, sapphire, quartz, GaN carbon, or the like can be used for the support substrate 11. In the polycrystalline SiC, various poly-types and crystal face of SiC crystal may be mixed. Polycrystalline SiC in which various poly-types and crystal face are mixed can be manufactured without severe temperature control, thus it can enable a reduction in the manufacturing cost of the support substrate 11. Thickness TT1 of the support substrate 11 needs to be set so as to obtain mechanical strength, which is able to withstand post-processing of semiconductor device manufacturing. For example, if the diameter of the support substrate 11 is 150 (mm), the thickness TT1 may be about 350 (micrometer).

Manufacturing Method of Bonded Substrate

A method of manufacturing the bonded substrate 10 according to the present embodiment will be described with reference to FIGS. 1 to 8. In the embodiment, as an example, a case where the support substrate 11 is polycrystalline 3C—SiC and the single-crystalline layer 13 is single-crystalline 4H—SiC will be described. Further, a case in which the manufacturing flow described herein is implemented by using delamination technique by hydrogen atom ablation will be described.

First, the support substrate 11 and the single-crystalline layer 13 are prepared. The support substrate 11 and the single-crystalline layer 13 have planarized surfaces. The planarization may be performed by polishing or cutting or may be performed by a CMP method.

Figure 1:
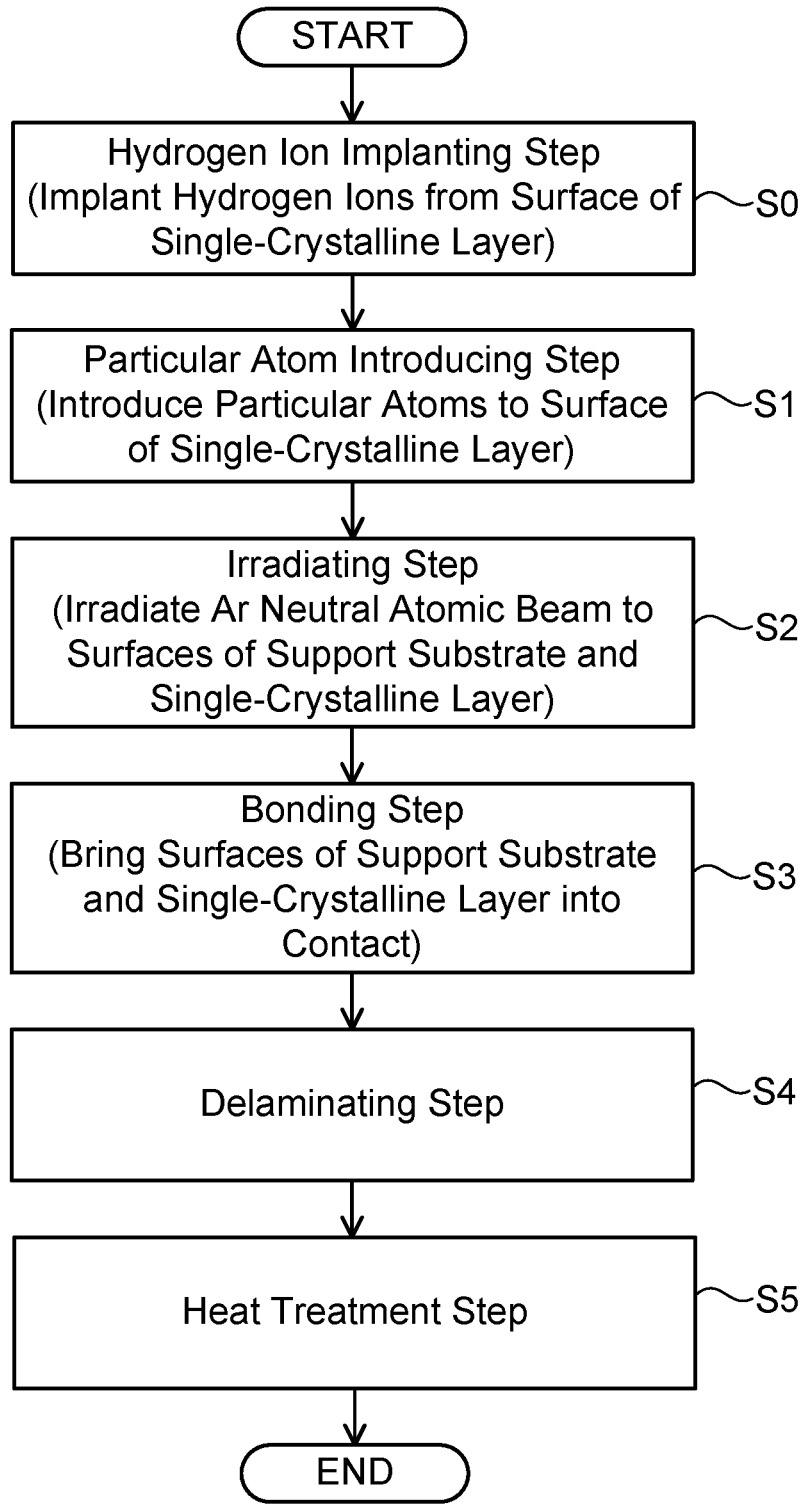
FIG. 1 is a flowchart showing a method of manufacturing a bonded substrate.

In step S0 of FIG. 1, a hydrogen ion implanting step of implanting hydrogen ions from a front surface 13a of the single-crystalline layer 13 is performed. When the hydrogen ions are implanted in the single-crystalline layer 13, the hydrogen ions reach depths corresponding to their incident energy, and are distributed in high density. Due to this, as shown in a schematic view of FIG. 3, a hydrogen implanted layer 15 is formed at a predetermined depth from the front surface. In the present embodiment, a case will be described in which the hydrogen implanted layer 15 is formed at a position at about 0.5 micrometer from the front surface.

In step S1, a particular atom introducing step is performed. Particular atoms may be any atoms so long as they can alter a crystal structure of the single-crystalline layer 13. Here, a configuration in which "the crystal structure of the single-crystalline layer 13 is altered" includes various types of configurations. For example, a configuration in which the crystal structure is altered by generating a large quantity of crystal defects is included. Further, a configuration in which the crystal structure itself is altered to a structure that is different from its structure before introduction of the particular atoms is included. Further, a configuration in which the single-crystalline layer 13 is amorphized is included. Further, a configuration in which a compound other than SiC is formed is included. Further, a configuration in which some sort of element is precipitated is included. Such configurations are mere examples. They do not exclude configurations other than the above.

The particular atoms may be atoms that bonds with Si and C. As an example of the particular atoms, at least one of nitrogen (N), phosphorus (P), arsenic (As), boron (B), aluminum (Al), silicon (Si), and carbon (C) may be exemplified. In this embodiment, a case of using nitrogen as the particular atoms will be described below. Neutral atomic beam of nitrogen is irradiated to the front surface 13a of the single-crystalline layer 13 using a FAB (Fast Atom Beam) gun. Due to this, as shown in a schematic view of FIG. 4, a high-density doping layer 13b is formed in a surface layer of the single-crystalline layer 13.

An introduced amount of nitrogen may be determined at a level by which the crystal structure of the single-crystalline layer 13 cannot be maintained, and the crystal structure alters from SiC. Specifically, it may be determined so that a ratio of nitrogen atoms in an element composition ratio in an interface layer 13c formed in step S5 to be described later becomes 1 (atomic %) or more. Alternatively, it may be determined so that a nitrogen density in the interface layer 13c becomes $1 \times 10^{21}$ (atoms/cm$^3$) or more. In other words, the interface layer 13c is a region where the particular atoms are contained at $1 \times 10^{21}$ (atoms/cm$^3$) or more. Alternatively, it may be determined so that a thickness of the interface layer 13c becomes 0.25 nanometer or more. 0.25 nanometer is a thickness corresponding to one atom layer. Since an atomic density of SiC is about $9.6 \times 10^{22}$ (atoms/cm$^3$), the nitrogen density of $1 \times 10^{21}$ (atoms/cm$^3$) corresponds to a ratio of the nitrogen atoms of 1 (atomic %). Further, the nitrogen density, of $1 \times 10^{22}$ (atoms/cm$^3$) corresponds to the ratio of the nitrogen atoms of 10 (atomic %).

Figure 5:
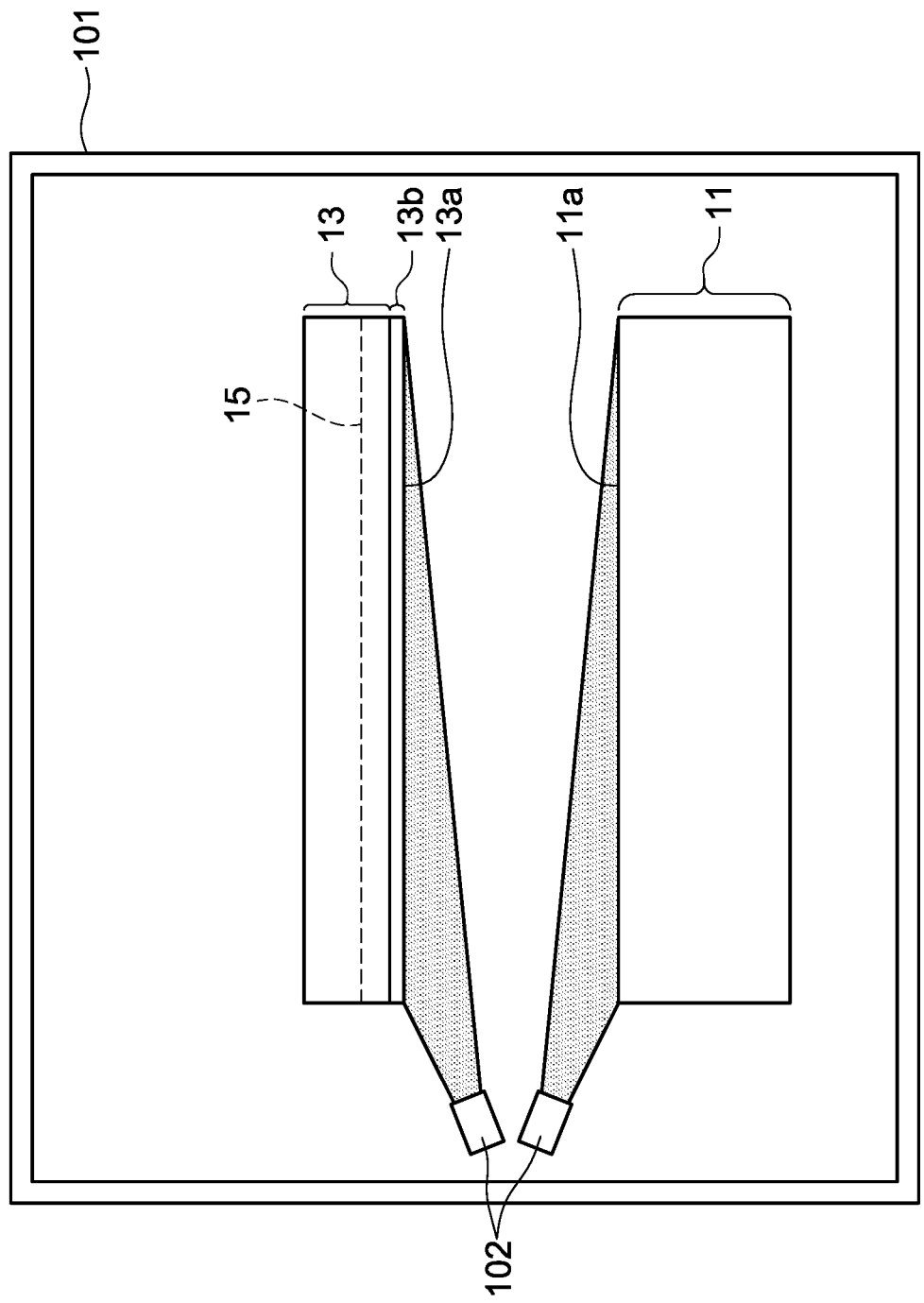
FIG. 5 is an explanatory diagram of an irradiation step of the bonded substrate.
Figure 6:
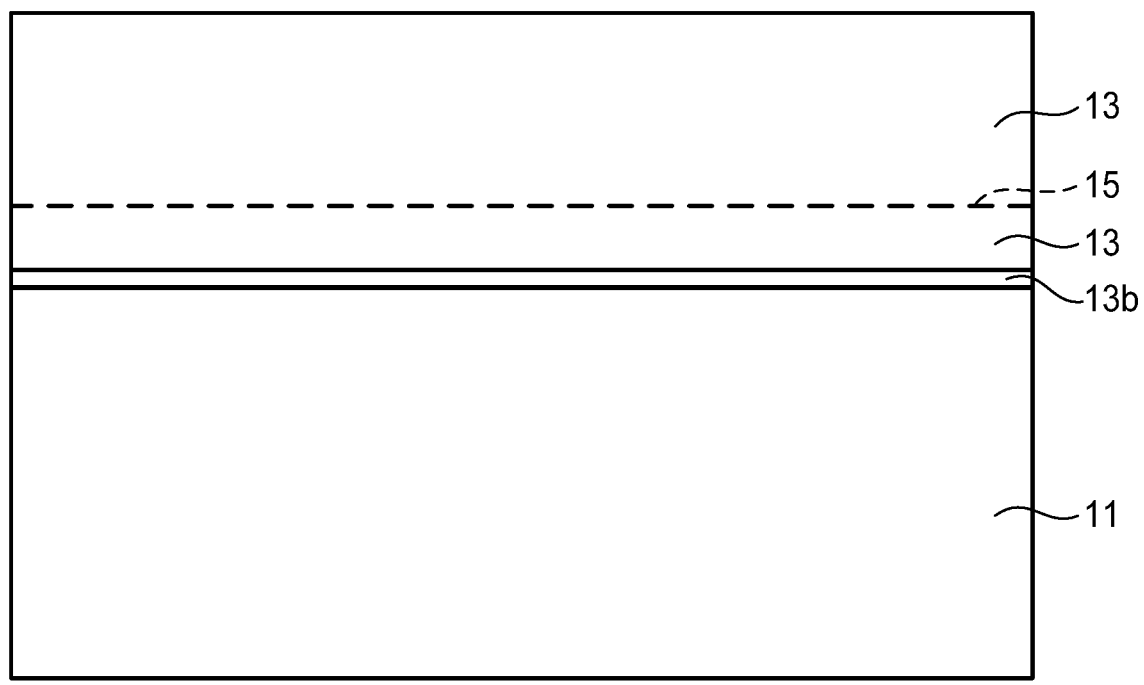
FIG. 6 is a schematic view of the bonded substrate.
Figure 7:
FIG. 7 is a schematic view of the bonded substrate.
Figure 8:
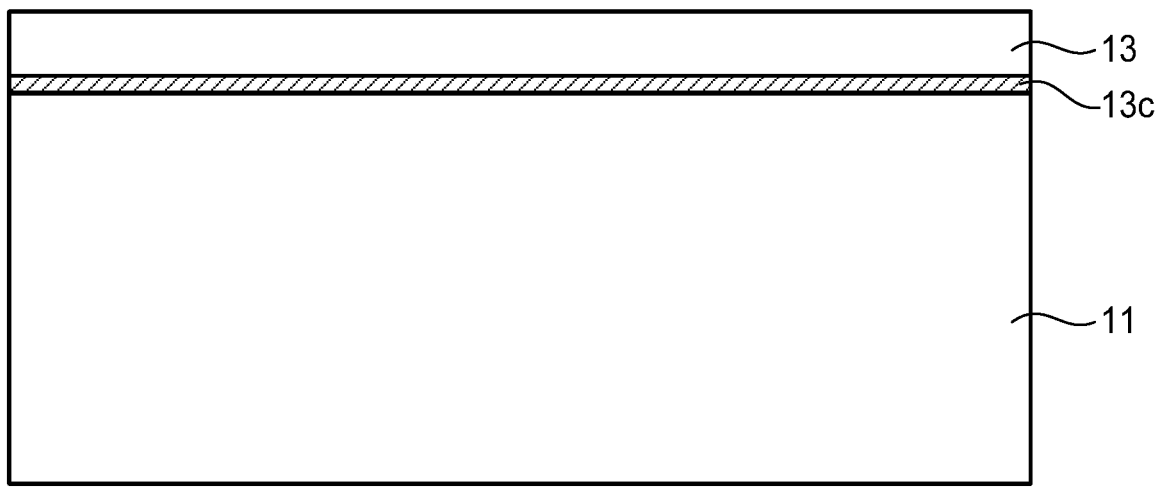
FIG. 8 is a schematic view of the bonded substrate.

In step S2 of FIG. 1, an irradiation step is performed. This will specifically be described. As shown in FIG. 5, the single-crystalline layer 13 and the support substrate 11 are set in a chamber 101. Next, relative positions of the single-crystalline layer 13 and the support substrate 11 are aligned. This alignment is performed so that these substrates come into contact under a correct positional relationship in a bonding step to be described later. Then, the chamber 101 is brought to a vacuumed state. A vacuum degree in the chamber 101 may for example be about $1 \times 10^{-4}$ to $1 \times 10^{-6}$ (Pa).

Next, neutral atomic beam of argon is irradiated to a front surface 11a of the support substrate 11 and the front surface 13a of the single-crystalline layer 13 using a FAB gun 102. The neutral atomic beam of argon is irradiated uniformly over an entirety of the front surface 11a and an entirety of the front surface 13a. By so doing, oxide films and absorption layers in the front surfaces 11a and 13a are removed and atomic bonds thereof can be exposed. This state is called an activated state. Further, since the irradiation step is performed under the vacuumed state, the front surfaces 11a and 13a maintain the active state without being oxidized.

The bonding step is performed in step S3 of FIG. 1. In the bonding step, the front surface 11a of the support substrate 11 and the front surface 13a of the single-crystalline layer 13 are brought into contact in the vacuumed state in the chamber 101. By so doing, the atomic bonding existing on the front surfaces in the activated state bond with each other, by which the support substrate 11 and the single-crystalline layer 13 can be bonded. Due to this, as shown in a schematic view of FIG. 6, a structure in which the support substrate 11 and the single-crystalline layer 13 are bonded is formed.

A delaminating step is performed in step S4 of FIG. 1. Specifically, the support substrate 11 and the single-crystalline layer 13 that are bonded to each other are heated to about 1000° C. A heat treatment step may be performed using a furnace. Due to this, the single-crystalline layer 13 can be separated at the hydrogen implanted layer 15. Thus, as shown in a schematic view of FIG. 7, a structure in which the thin single-crystalline layer 13 having the thickness of 0.5 micrometer is bonded on the support substrate 11 via the high-density doping layer 13b can be formed.

The heat treatment step is performed in step S5 of FIG. 1. In the heat treatment step, the support substrate 11, the high-density doping layer 13b, and the single-crystalline layer 13 are heat-treated. A heat treatment temperature is set higher than 1100° C. The heat treatment temperature may be set to a temperature by which introduced nitrogen stabilizes, and may be heated to 1500° C. or more (preferably about 1700° C.). The heat treatment step may be performed in the furnace in which the delaminating step was performed. Due to this, chemical composition of SiC in the high-density doping layer 13b alters to a composite material containing carbon, silicon, and nitrogen. An example of the composite material may be carbon-containing silicon nitride (SixCyNz). Further, the crystal structure alters from SiC. Due to this, as shown in a schematic view of FIG. 8, the high-density doping layer 13b alters to an interface layer 13c.

Measurement of Interface Resistance

Figure 9:
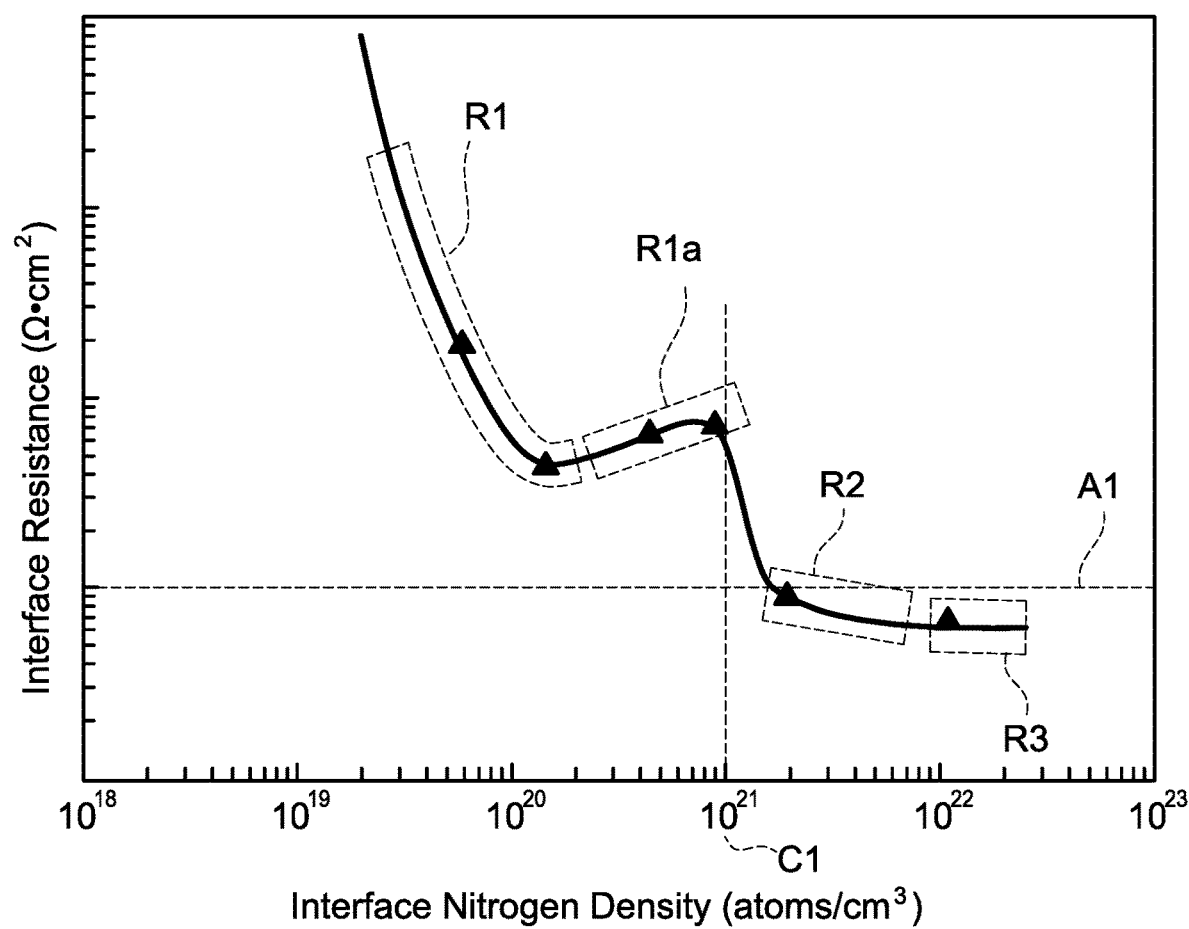
FIG. 9 is a graph showing a relationship between an introduced amount of nitrogen and an interface resistance.

A change in the interface resistance in a case of changing the amount of nitrogen introduced in step S1 will be described with reference to FIG. 9. A measurement target is the 4H—SiC single-crystalline layer 13 and the polycrystalline 3C—SiC support substrate 11 bonded by the bonding method described herein. In FIG. 9, a vertical axis is the interface resistance ($\Omega \cdot cm^2$). A horizontal axis is the nitrogen density (atoms/cm$^3$) in the interface of the single-crystalline layer 13 and the support substrate 11. Further, a target interface resistance value is defined as a target resistance value A1.

A state of the interface may be in one of three states R1, R2, and R3 depending on the nitrogen density. This will be described below.

The state R1 will be described. The state R1 is a state in which the nitrogen density in the interface is $1 \times 10^{20}$ (atoms/cm$^3$) or less. An energy barrier is generated in the bonded interface of the single-crystalline layer 13 and the support substrate 11. A width of the energy barrier may be reduced by introducing impurities that generate n-type high density carriers (e.g., phosphorus and nitrogen) to a vicinity of the interface. Since a tunneling effect can be achieved thereby, the interface resistance can be reduced.

As above, the nitrogen density for a case of generating carriers is normally about $1 \times 10^{19}$ to $1 \times 10^{20}$ (atoms/cm$^3$). However, when the nitrogen density in the interface is within this density range, the interface resistance does not drop to the target resistance value A1 as shown by the state R1 of FIG. 9. Further, in a case where the nitrogen density in the interface is in a range of $1 \times 10^{20}$ to $1 \times 10^{21}$ (atoms/cm$^3$) beyond the density that is normally employed, the interface resistance increases as shown by a state R1a. This is assumed as a result of an effect of increasing the interface resistance caused by increase in defects excels over an effect of reducing the interface resistance by the tunneling effect.

The state R2 will be described. The state R2 is a state in which the nitrogen density in the interface is higher than $1 \times 10^{21}$ (atoms/cm$^3$) and lower than $1 \times 10^{22}$ (atoms/cm$^3$). When the state shifts from the state R1 to the state R2, the interface resistance drops abruptly, and reaches the target resistance value A1. As above, it can be understood that a specific nitrogen density C1 of $1 \times 10^{21}$ (atoms/cm$^3$) is a point of singularity.

The SiC atomic density is about $9.6 \times 10^{22}$ (atoms/cm$^3$). As such, in the case where the nitrogen density in the interface is at the specific nitrogen density C1 ($1 \times 10^{21}$ (atoms/cm$^3$)), an atomic ratio of nitrogen becomes about 1 (atomic %). The interface to which 1 (atomic %) nitrogen is introduced can be said as being in a state where nitrogen exists at a very high density. In the state where nitrogen exists at a very high density, nitrogen atoms are not substituted at positions of lattice points of SiC crystal, so the nitrogen atoms do not function as donors. Further, since the nitrogen atoms are not substituted at the positions of the lattice points, a quantity of crystal defects becomes very large in the interface. Thus, in the interface, the crystal structure alters from SiC. From this respect as well, it can be understood that the nitrogen density that is at the specific nitrogen density C1 ($1 \times 10^{21}$ (atoms/cm$^3$)) or more is a super-high density doping condition that cannot be used as a normal doping condition (that is, a doping condition for generating carriers).

Figure 11:
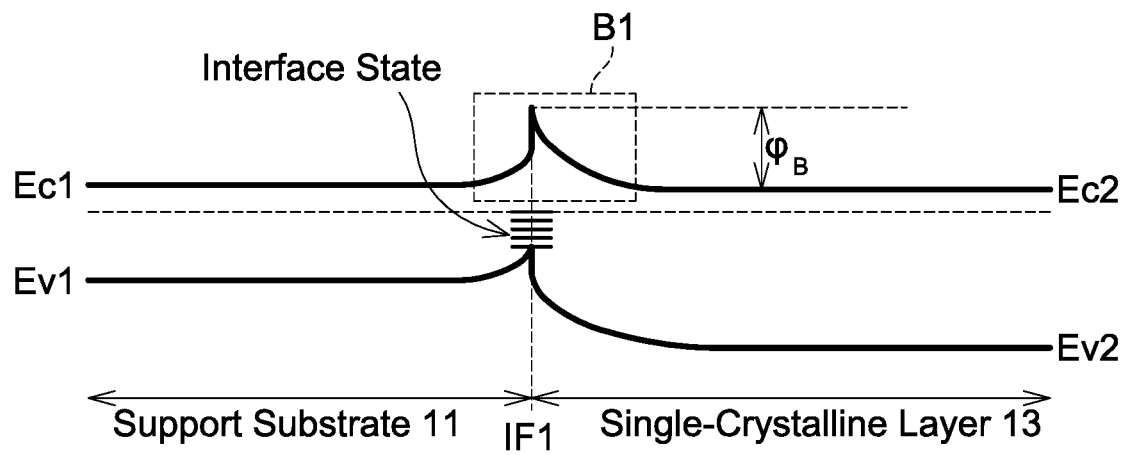
FIG. 11 is a diagram showing an electrogenesis mechanism model.

A model of a phenomenon of achieving abrupt drop in the interface resistance by setting the nitrogen density in the interface to the specific nitrogen density C1 ($1 \times 10^{21}$ (atoms/cm$^3$)) or more has not yet been explicated. An electrogenesis mechanism model exhibited in the state R2 will be described with reference to FIGS. 11 and 12. This model is proposed by the present inventors. FIG. 11 is a comparative example. FIG. 11 shows a band diagram for the case of directly bonding the polycrystalline 3C—SiC support substrate 11 and the 4H—SiC single-crystalline layer 13. It is assumed that a potential barrier B1 is generated in a bonded interface IF1 and in regions in vicinity thereof due to a difference in bandgaps of 4H and 3C and by generation of interface charges due to a discrepancy in the bonded interface and the like. The interface resistance becomes high due to this potential barrier B1.

Figure 12:
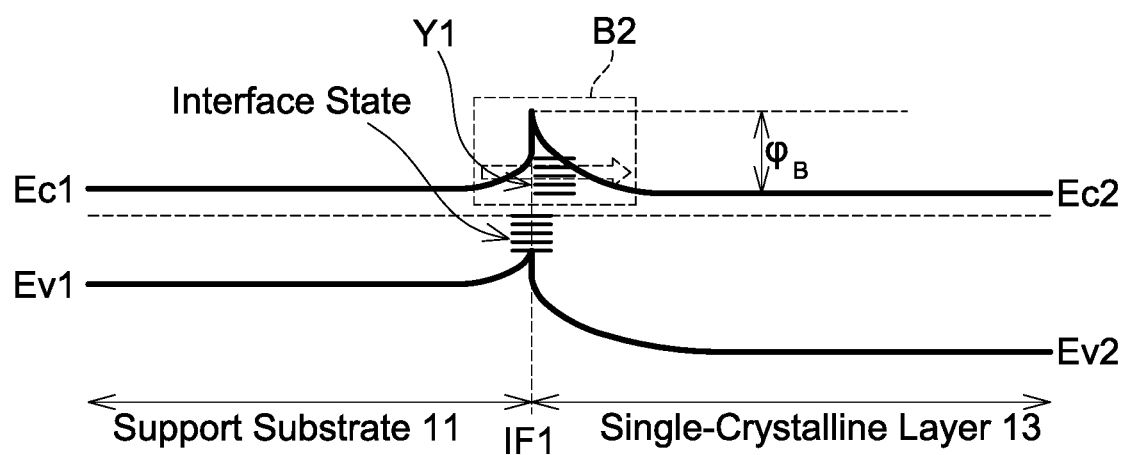
FIG. 12 is a diagram showing an electrogenesis mechanism model.

FIG. 12 shows a band diagram of the semiconductor substrate in the state R2. A potential barrier B2 exists between the support substrate 11 and the single-crystalline layer 13. However, the interface resistance between the support substrate 11 and the single-crystalline layer 13 can be reduced by increasing a tunneling effect of the potential barrier B2 by trap assisted tunneling. The trap assisted tunneling is a phenomenon in which charge carriers tunnel through traps. As aforementioned, the nitrogen atoms are introduced at an excessive degree beyond the normally-used range in the vicinity of the interface in the state R2. Thus, due to being in the state with a very large quantity of defects in the interface, it is a state with a high trap density (see an arrow Y1 in FIG. 12). Thus, the trap assisted tunneling can effectively be generated.

In the state R2, the chemical composition of the interface may in some cases not alter to the composite material containing carbon, silicon, and nitrogen. Thus, the interface layer 13c may not be observed by TEM and the like in the state R2.

The state R3 will be described. The state R3 is a state in which the nitrogen density in the interface is $1 \times 10^{22}$ (atoms/cm$^3$) or more. In the state R3 as well, the interface resistance can be set to a state being lower than the target resistance value A1. This is because in the state R3 as well, similar to the state R2, the interface resistance can be reduced by the trap assisted tunneling. The state R3 is a state in which nitrogen atoms exist at a very high density in the interface. Thus, in the state R3, the crystal defects can be generated it a very large quantity in the interface, and the chemical composition of SiC in the interface can be altered to the composite material containing carbon, silicon, and nitrogen. Thus, in the state R3, an interface layer with a thickness of a few nanometer can be observed by TEM and the like between the single-crystalline layer 13 and the support substrate 11.

In the element composition ratio in the interface, the ratio of the nitrogen atoms is preferably 10 (atomic %) or more. Alternatively, the nitrogen density in the interface is preferably $1 \times 10^{22}$ (atoms/cm$^3$) or more. This is because it has been experimentally discovered by the present inventors that, by setting the nitrogen density in the interface to the value as above or more, bonding strength can be increased sufficiently to a degree by which no delamination occurs in the bonded interface.

Measurement of Interface Layer Thickness

Further, a thickness of the interface layer 13c was measured using TEM. A change in the thickness of the interface layer 13c by changing the amount of nitrogen introduced in step S1 was measured. In the case where the nitrogen density of the interface layer 13c is $1 \times 10^{22}$ (atoms/cm$^3$), the thickness of the interface layer 13c was about 3.6 to 3.9 (nanometer). There are various parameters that determine the thickness of the interface layer 13c aside from the introduced amount of nitrogen. For example, the thickness of the interface layer 13c changes also by an energy level for introducing nitrogen. Thus, the thickness of the interface layer 13c as above is merely an example.

Nitrogen Density Profile Analysis

A nitrogen density profile of the interface layer 13c in the bonded substrate 10 fabricated by the bonding method described herein was analyzed. The bonded substrate 10 used for the analysis is a substrate that bonds the polycrystalline 3C—SiC support substrate 11 with the 4H—SiC single-crystalline layer 13 via the interface layer 13c. Further, the nitrogen density profile for the case where the nitrogen density of the interface layer 13c is $1 \times 10^{22}$ (atoms/cm$^3$) was analyzed. The thickness of the interface layer 13c was in a range of 3.6 to 3.9 nanometer.

Figure 10:
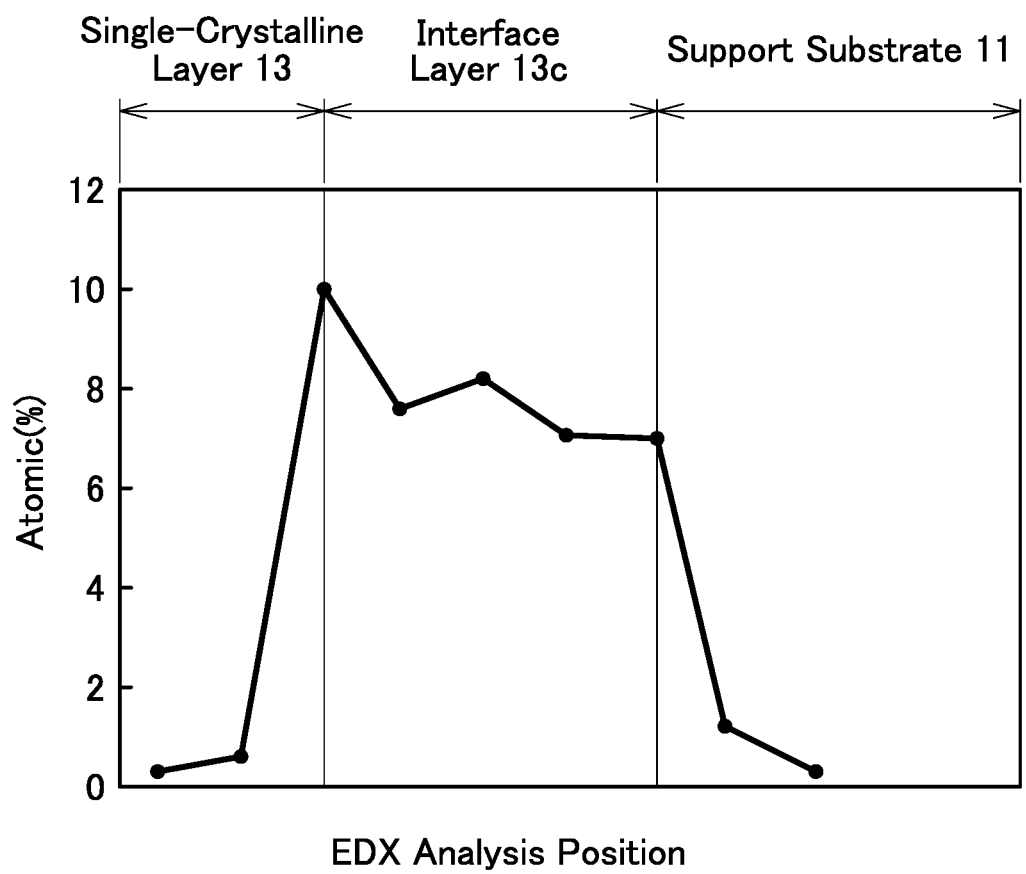
FIG. 10 is a graph showing a nitrogen density profile of an interface.

The nitrogen density analysis was performed using energy dispersive X-ray spectroscopy (EDX) method. An elemental analyzer was VOYAGERIII M3100 manufactured by NORAN. As shown in FIG. 10, the nitrogen composition ratio in the interface layer 13c was in a range of 7 to 10 (atomic %). On the other hand, the nitrogen composition ratio in the support substrate 11 and the single-crystalline layer 13 was 1 (atomic %) or less. As above, it can be understood that the nitrogen exists at a high density only in the interface layer 13c.

Effects

The polycrystalline 3C—SiC support substrate 11 and the 4H—SiC single-crystalline layer 13 can be bonded via the interface layer 13c. The interface layer 13c is a layer in which the chemical composition thereof is altered from silicon carbide (SiC) to the composite material containing carbon, silicon, and nitrogen due to its excessive introduction of nitrogen beyond the normally-used condition. Further, it is also a layer in which the crystal structure is altered from SiC. Due to this, the interface resistance can be reduced as compared to the case of directly bonding the polycrystalline 3C—SiC support substrate 11 and the 4H—SiC single-crystalline layer 13.

When an element such as phosphorus, of which handling is difficult, is used as the element to be excessively introduced to the interface layer 13c, manufacturing cost might increase. This is because there may be a need to provide detoxication measures for gases generated in a manufacturing device, or an increased frequency of periodical cleaning of the manufacturing device. The technique disclosed herein can use nitrogen as the element to be excessively introduced. Since handling of nitrogen is easier as compared to phosphorus, the manufacturing cost can be suppressed.

Modification

An embodiment of the present invention has been described in detail with reference to the drawings, however, this is a mere exemplary indication and thus does not limit the scope of the claims. The art described in the claims includes modifications and variations of the specific examples presented above.

The particular atoms may be silicon (Si). In this case, the element composition ratio in the interface comes to have a larger ratio of silicon than of carbon. In this case, the interface may be said as being constituted of silicon-enriched SiC. For example, the silicon composition ratio comes to be in a range of 51 to 60 (atomic %). Since the interface is in a state having silicon existing at a very high density, it cannot maintain the SiC crystal structure, and the crystal structure alters from SiC. That is, the interface is configured of a composite material containing carbon and silicon. Since there is a large quantity of crystal defects in the interface, the interface resistance can be dropped abruptly according to the aforementioned electrogenesis mechanism model.

Further, the particular atoms may be carbon (C). In this case, the element composition ratio in the interface comes to have a larger ratio of carbon than of silicon. In this case, the interface may be said as being constituted of carbon-enriched SiC. For example, the carbon composition ratio comes to be in a range of 51 to 60 (atomic %). In this case as well, the crystal structure alters from SiC. That is, the interface is configured of a composite material containing carbon and silicon.

In the particular atom introducing step described in step S1, various introduction methods may be employed. For example, a plasma doping method that ionizes and dopes impurity gas to be doped may be used, for example. Further, ion implantation may be used. In the ion implantation, an impurity concentration may be controlled to have its peak at the front surface of the single-crystalline layer 13 by using multilevel implantation in which implantation is performed plural times by changing acceleration energy. Further, a heat diffusion method of providing impurities at a high density in the front surface of the single-crystalline layer 13 and heating them may be used. Further, various types of devices, such as an ion gun, may be used other than the FAB gun.

In the particular atom introducing step described in step S1, a case of introducing the particular atoms only to the single crystalline layer 13 is described, however, no limitation is made to this configuration. The particular atoms may be introduced to both the single-crystalline layer 13 and the support substrate 11, or may be introduced only to the support substrate 11.

The irradiation step (step S2) and the particular atom introducing step (step S1) may be combined. Specifically, in the particular atom introducing step, the atomic beam of the particular atoms may be irradiated to the front surfaces of the support substrate 11 and the single-crystalline layer 13. By so doing, the process of implanting the particular atoms to the support substrate 11 and to the single-crystalline layer 13 can be caused to function also as the process for activating the front surfaces of the support substrate 11 and the single-crystalline layer 13. A number of steps can thereby be reduced.

The delaminating step (step S4) and the heat treatment step (step S5) may be combined. Specifically, in the delaminating step, the heating may be performed at a temperature that is higher than the temperature by which the particular atoms stabilize (e.g., 1100° C.). The number of steps can thereby be reduced.

A SiC single-crystalline layer with a thickness as needed may be epitaxially grown on the single-crystalline layer 13 after the heat treatment step (step S5). This epitaxial layer becomes a forming region for respective devices. A thickness of the epitaxial layer required for formation of respective devices is generally 5 micrometer or more.

The single-crystalline layer 13 is not limited to the 4H—SiC single crystalline. Various polytype single-crystalline SiC such as 3C—SiC and 6H—SiC may be used as the single-crystalline layer 13. The support substrate 11 is not limited to the 3C—SiC polycrystalline. Various polytype polycrystalline SiC may be used.

The single-crystalline layer 13 is not limited to SiC. It may be GaN, AlN, Si, or C single crystalline. The material used as the support substrate 11 is not limited to polycrystalline SiC. Any material may be used so long as the material has resistance to various types of heat processing to be applied to the single-crystalline layer 13.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor substrate comprising:
a single-crystalline SiC substrate; and
a polycrystalline SiC substrate,
wherein
the single-crystalline SiC substrate and the polycrystalline SiC substrate are bonded via an interface layer,
the interface layer is a composite material containing carbon and silicon,
the interface layer contains $1 \times 10^{21}$ (atoms/cm$^3$) or more of silicon (Si) atoms, and
in an element composition ratio in the composite material, a ratio of silicon is more than that of carbon.

2. The semiconductor substrate according to claim 1, wherein
a thickness of the interface layer is equal to or more than 0.25 nanometer.

3. The semiconductor substrate according to claim 1, wherein
the interface layer is a composite material containing carbon, silicon, and nitrogen.

4. The semiconductor substrate according to claim 1, wherein
the interface layer is a composite material containing carbon, silicon, and phosphorus.

5. The semiconductor substrate according to claim 1, wherein
the interface layer contains $1 \times 10^{22}$ (atoms/cm$^3$) or more of the silicon atoms.

6. The semiconductor substrate according to claim 1, wherein
in an element composition ratio in the interface layer, a ratio of the silicon atoms is 10 (atomic %) or more.

7. The semiconductor substrate according to claim 1, wherein
the single-crystalline SiC substrate is 4H—SiC.

8. The semiconductor substrate according to claim 1, wherein
the polycrystalline SiC substrate is 3C—SiC.

9. A semiconductor substrate comprising:
a single-crystalline SiC substrate; and
a polycrystalline SiC substrate,
wherein
the single-crystalline SiC substrate and the polycrystalline SiC substrate are bonded via an interface layer,
the interface layer is a composite material containing carbon and silicon,
the interface layer contains $1 \times 10^{21}$ (atoms/cm$^3$) or more of carbon (C) atoms, and
in an element composition ratio in the composite material, a ratio of carbon is more than that of silicon.

10. The semiconductor substrate according to claim 9, wherein
a thickness of the interface layer is equal to or more than 0.25 nanometer.

11. The semiconductor substrate according to claim 9, wherein
the interface layer is a composite material containing carbon, silicon, and nitrogen.

12. The semiconductor substrate according to claim 9, wherein
the interface layer is a composite material containing carbon, silicon, and phosphorus.

13. The semiconductor substrate according to claim 9, wherein
the interface layer contains $1 \times 10^{22}$ (atoms/cm$^3$) or more of the carbon atoms.

14. The semiconductor substrate according to claim 9, wherein
in an element composition ratio in the interface layer, a ratio of the carbon atoms is 10 (atomic %) or more.

15. The semiconductor substrate according to claim 9, wherein
the single-crystalline SiC substrate is 4H—SiC.

16. The semiconductor substrate according to claim 9, wherein
the polycrystalline SiC substrate is 3C—SiC.

* * * * *